United States Patent
Jeun et al.

(10) Patent No.: US 7,449,774 B1
(45) Date of Patent: *Nov. 11, 2008

(54) SEMICONDUCTOR POWER MODULE HAVING AN ELECTRICALLY INSULATING HEAT SINK AND METHOD OF MANUFACTURING THE SAME

(75) Inventors: Gi-Young Jeun, Bucheon (KR); O-Seob Jeun, Seoul (KR); Eun-Ho Lee, Bucheon (KR); Seung-Won Lim, Anyang (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/677,558

(22) Filed: Sep. 29, 2000

(30) Foreign Application Priority Data

Oct. 1, 1999 (KR) ................................ 1999-42217

(51) Int. Cl.
*H01L 23/34* (2006.01)
(52) U.S. Cl. .................. 257/712; 257/675; 257/676; 257/723; 257/787; 257/E33.075; 257/E23.037
(58) Field of Classification Search ......... 257/723–725, 257/690, 696, 706, 712, 720, 718, 719, 675–676, 257/666, 667, 668, 67.1, 674, 692, 695, 705, 257/707, 709, 710, 713, 717, 730, 731, 669, 257/796, 773, 786–787, E33.075, E31.131, 257/E23.051, E23.08, E23.081, E23.082, 257/E23.083, E23.031, E23.032, E23.037, 257/E23.039, E23.043, E23.048, E23.052, 257/E23.056
See application file for complete search history.

(56) References Cited

U.S. PATENT DOCUMENTS

| | | | | |
|---|---|---|---|---|
| 3,956,726 | A * | 5/1976 | McCarthy et al. | 337/414 |
| 5,031,029 | A * | 7/1991 | Acocella et al. | 257/712 |
| 5,057,906 | A * | 10/1991 | Ishigami | |
| 5,227,662 | A * | 7/1993 | Ohno et al. | |
| 5,258,649 | A * | 11/1993 | Tanaka et al. | 257/787 |
| 5,430,331 | A * | 7/1995 | Hamzehdoost et al. | 257/796 |
| 5,440,169 | A * | 8/1995 | Tomita et al. | |
| 5,530,295 | A * | 6/1996 | Mehr | |
| 5,635,751 | A * | 6/1997 | Ikeda et al. | 257/584 |
| 5,703,399 | A | 12/1997 | Majumdar et al. | 257/723 |
| 6,191,478 | B1 * | 2/2001 | Chen | 257/718 |
| 6,239,487 | B1 * | 5/2001 | Park et al. | 257/712 |

(Continued)

FOREIGN PATENT DOCUMENTS

DE 69614195 4/2002

(Continued)

*Primary Examiner*—Theresa T. Doan
*Assistant Examiner*—Dilinh Nguyen
(74) *Attorney, Agent, or Firm*—Marshall Gerstein & Borun LLP

(57) ABSTRACT

A semiconductor power module includes a lead frame having a first portion at a first level, a second portion surrounding the first portion at a second level, and a plurality of terminals connected to the second portion. The semiconductor power module further includes a power circuit mounted on a first surface of the first portion and an insulator having an electrically insulating property and thermal conductivity. The insulator is adjacent to a second surface of the first portion of the lead frame. The semiconductor power module further includes a sealer having an electrically insulating property that covers the power circuit and the control circuit.

9 Claims, 3 Drawing Sheets

U.S. PATENT DOCUMENTS 6,281,574 B1 * 8/2001 Drake et al.
6,432,750 B2 * 8/2002 Jeon et al. .................. 438/122
6,471,822 B1 * 10/2002 Yin et al. ............... 156/345.49

FOREIGN PATENT DOCUMENTS

| | | |
|---|---|---|
| JP | 5-294744 | 11/1993 |
| JP | 05299576 | 11/1993 |
| JP | 6-37250 | 12/1993 |
| JP | 6-291362 | 10/1994 |
| JP | 8-204120 | 8/1996 |
| JP | 9-102580 | 4/1997 |
| JP | 9 139461 | 5/1997 |
| JP | 10093015 | 4/1998 |
| JP | 2000-138342 | 5/2000 |

* cited by examiner

SEMICONDUCTOR POWER MODULE HAVING AN ELECTRICALLY INSULATING HEAT SINK AND METHOD OF MANUFACTURING THE SAME

BACKGROUND OF THE INVENTION

1. Field of the Invention

The invention relates generally to a semiconductor power module and, more particularly, the invention relates to a semiconductor power module having an electrically insulating heat sink.

2. Description of Related Technology

Generally speaking, a semiconductor power module is a packaged structure that typically includes a plurality of semiconductor die, which form a power circuit and a control circuit. These semiconductor die are mounted to die pads of a lead frame, which is molded together with a radiating metal plate (commonly referred to as a "heat sink") using epoxy resin.

As is well known, the power circuit within a semiconductor power module typically includes a power semiconductor element (e.g., a power transistor) that functions as a power switching device and the control circuit typically includes a driving element for driving (i.e., turning on and off) the power semiconductor element and a protection element that protects the power semiconductor element from damage due to overcurrent conditions, excessive temperatures, etc. In general, the power circuit is structured to radiate a substantial amount of heat because a significant amount of power is controlled and dissipated by the power semiconductor element. On the other hand, the control circuit typically draws small currents and does not dissipate an appreciable amount of power and, as a result, the control circuit typically does not have to be structured to radiate a substantial amount of heat.

As is also generally known, the management of heat generated within a conventional semiconductor power module is complicated by the fact that the power circuit and the control circuit have significantly different heat dissipation requirements. Some developments have attempted to address the differential heat generation characteristics of the power circuit and control circuit within a semiconductor power module while attempting to provide a simple, cost-effective structure. For example, U.S. Pat. No. 5,703,399 generally discloses a semiconductor power module having a lead frame, power and control circuits formed on the lead frame, an electrically conductive heat sink positioned adjacent to the power circuit and a sealer interposed between the heat sink and the lead frame that electrically insulates the heat sink from the lead frame and the circuit components mounted thereto. Unfortunately, the structure disclosed in U.S. Pat. No. 5,703,399 requires a heat sink and a separate insulating layer and further requires that the heat sink be spaced in a uniform and stable manner to the control parasitic electrical effects that are produced as a result of using an electrically conductive material for the heat sink.

SUMMARY OF THE INVENTION

In accordance with one aspect of the invention, a semiconductor power module includes a lead frame having a first portion at a first level, a second portion surrounding the first portion at a second level, and a plurality of terminals connected to the second portion. The semiconductor power module may further include a power circuit mounted on a first surface of the first portion and an insulator having an electrically insulating property and thermal conductivity. The insulator may be adjacent to a second surface of the first portion of the lead frame. Additionally, the semiconductor power module may further include a sealer having an electrically insulating property that covers the power circuit.

In accordance with another aspect of the invention, a method of manufacturing a semiconductor power module having a lead frame with a first portion at a first level and a second portion surrounding the first portion at a second level includes the steps of die-bonding a power circuit onto a first surface of the first portion of the lead frame and wire bonding electrodes of the power circuit to corresponding portions of the lead frame. The method may further include the steps of molding the lead frame and the power circuit with a sealer and adhering an insulator with thermal conductivity and an electrically insulating property onto a second surface of the first portion.

The invention itself, together with further objectives and attendant advantages, will best be understood by reference to the following detailed description, taken in conjunction with the accompanying drawings and the appended claims.

DETAILED DESCRIPTION OF THE INVENTION

The semiconductor power module described herein uses an electrically insulating heat sink to dissipate the heat generated by a power circuit within the semiconductor power module. Generally speaking, the semiconductor power module described herein includes a power circuit that is mounted to a lead frame and which is covered with an electrically insulating sealant to protect the circuit from environmental damage. The semiconductor power module described herein also includes an electrically insulating heat sink that is adjacent to the lead frame and which dissipates heat generated by the power circuit. Because the heat sink is made of an electrically insulating material, a separate insulating layer is not required between the heat sink and the lead frame and, in some embodiments, the heat sink may directly contact the lead frame. Furthermore, the electrically insulating heat sink of the semiconductor power module described herein does not produce the undesirable parasitic electrical effects (e.g., parasitic capacitance, etc.) such as those which are caused by the electrically conductive heat sinks used within conventional semiconductor power modules.

Figure 1:
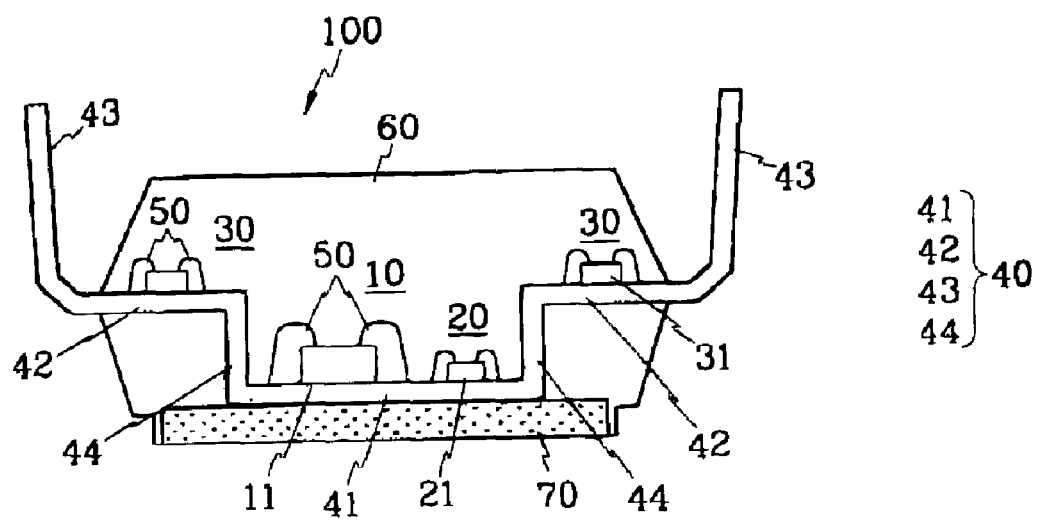
FIG. 1 is an exemplary cross-sectional diagrammatic view of a semiconductor power module according to one embodiment of the invention.

FIG. 1 is an exemplary cross-sectional diagrammatic view of a semiconductor power module 100 according to one embodiment of the invention. As shown in FIG. 1, the semiconductor power module 100 includes a centrally positioned power circuit 10, a heat detection circuit 20 that detects the loss heat produced by the power circuit 10, and a peripherally positioned control circuit 30 that controls the operation of the power circuit 10.

The power circuit 10 includes a power semiconductor element 11 that performs a switching operation. The power semiconductor element 11 typically includes emitter, collector and gate electrodes and may, for example, be a metal oxide semiconductor field effect transistor (MOSFET) or any other suitable switching device. In operation, the power semiconductor element 11 switches a flow of current from the collector electrode to the emitter electrode based on a signal that is applied to the gate electrode. The power circuit 10 may further include a protection circuit (not shown) that prevents the power semiconductor element 11 from being damaged by excessive reverse currents.

The heat detection circuit 20 includes a thermistor element 21, which is used by the heat detection circuit 20 to detect the loss heat produced by the power semiconductor element 11. The heat detection circuit 20 monitors the operational temperature of the power semiconductor element 11 (and the power circuit 10) to prevent the power circuit 10 from being damaged as a result of an over-temperature condition.

The control circuit 30 is electrically coupled to the power circuit 10 and includes an integrated circuit element 31. The control circuit 30 may further include a resistance element and/or a capacitive element (neither of which are shown).

The power semiconductor element 11, the thermistor element 21 and the integrated circuit element 31 are all mounted to a lead frame 40, which is formed from a material having a high thermal conductivity such as copper. The power semiconductor element 11, the thermistor element 21 and the integrated circuit element 31 are electrically coupled to suitable portions of the lead frame 40 via bonding wires 50, which may, for example, be made of gold, aluminum or any other suitable material.

A sealer 60 covers the lead frame 40, the power semiconductor element 11, the thermistor 21, the integrated circuit element 31 and the bonding wires 50. The sealer 60 provides resistance to environmental elements such as moisture, vibration, corrosive gases and liquids, etc. Additionally, the sealer 60 provides a good electrical insulation property and a good thermal conductivity.

An insulator 70 may be formed at the bottom surface of the lead frame 40, which is opposite to surface on which the power semiconductor element 11 is mounted. The insulator 70 is made of a material having a good thermal conductivity and a good electrical insulation property. For example, materials such as $Al_2O_3$, AlN and BeO may be used to form the insulator 70. Of course, other materials having good thermal conductivity and electrical insulation properties may be used instead without departing from the scope and spirit of the invention. Because the insulator 70 has good electrical insulation properties, the insulator 70 may directly contact the lead frame 40 without causing electrical shorting or undesirable parasitic effects such as those which are typically caused by conventional electrically conductive heat sinks. However, in some applications it may be desirable to allow the sealer 60 to completely encapsulate the semiconductor power module 100 such that the sealer 60 covers the bottom surface of the lead frame 40. In that case, the insulator 70 may be mounted directly to the sealer 60 without concern for uniform and/or stable spacing of the insulator 70 from the lead frame 40 because the insulator 70 does not introduce the parasitic electrical effects such as those introduced by the electrically conductive heat sinks which are used within conventional semiconductor power modules. Thus, the semiconductor power module described herein does not require a separate heat sink and insulator as do conventional semiconductor power modules because the insulator 70 functions as a heat sink.

Figure 2:
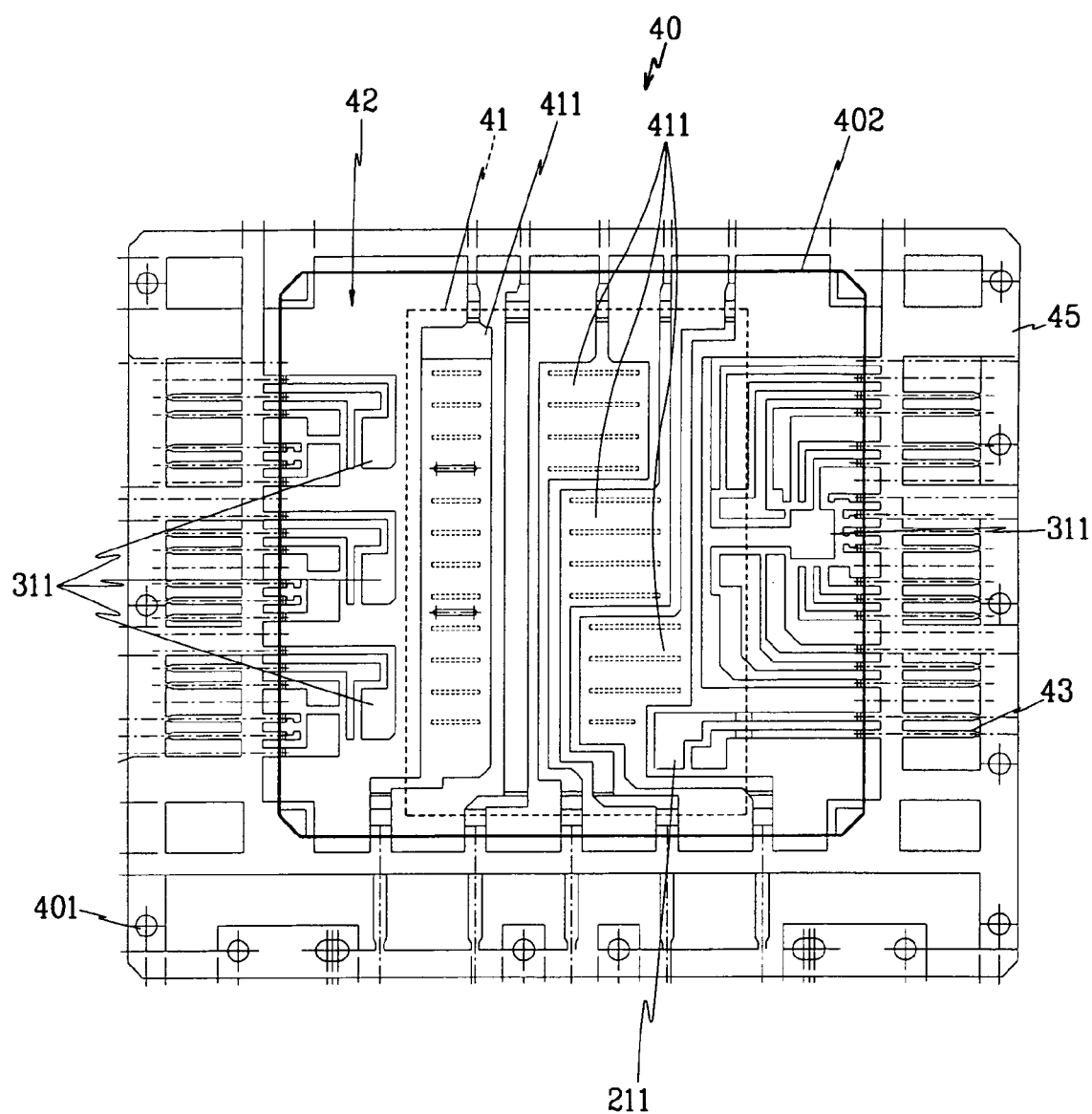
FIG. 2 is an exemplary plan view of a lead frame that may be used within the semiconductor power module shown in FIG. 1.

FIG. 2 is an exemplary plan view of the lead frame 40 that may be used within the semiconductor power module 100 shown in FIG. 1. As shown in FIG. 2, the lead frame 40 has a centrally positioned first portion 41, which is indicated by a dashed line, and a second portion 42 surrounding the first portion 41 that is indicated by a broad solid line. The first portion 41 of the lead frame 40 includes a power pad 411, upon which the power semiconductor element 11 is mounted, and a heat detection pad 211, upon which the thermistor element 21 is mounted. Additionally, the second portion 42 of the lead frame 40 includes a control pad 311, upon which the integrated circuit element 31 is mounted.

The lead frame 40 further includes an interconnection wiring pattern that interconnects the power circuit 10, the heat detection circuit 20 and the control circuit 30 via the wires 50. This interconnection wiring pattern also interconnects the power circuit 10, the heat detection circuit 20 and the control circuit 30 to external terminals 43 (which are part of the second portion 42) to enable the input or output of electrical signals through the terminals 43. Those of ordinary skill in the art will recognize that the interconnection pattern formed by the lead frame 40 may be varied to suit the desired circuit function within any particular application.

The lead frame 40 further includes a plurality of opening portions 401 that may be used to fixture the position of the lead frame 40 during assembly of the semiconductor power module 100. As shown in FIG. 2, the terminals 43 are connected to the pads 211, 311 and 411 to form a unitary structure via a connection part 45. After the molding process is completed, as shown in FIG. 1, the connection part 45 is cut off so that the terminals 43 are separated from each another.

Preferably, the lead frame 40 is made of a copper material or a copper-based alloy material. Also preferably, the lead frame 40 is surface treated to prevent the lead frame 40 from oxidizing. For example, the surface of the lead frame 40 may be electroplated using nickel or any other suitable plating material. In some embodiments it may be desirable to provide additional electroplating material thickness on portions of the lead frame 40 that are used as mounting pads for semiconductor chips.

Referring again to FIG. 1, the lead frame 40 is bent at an obtuse angle about a bent portion 44 so that the first portion 41 and the second portion 42 are at different levels and so that the first portion 41 is closer to the insulator 70 than the second portion 42. With the structure shown in FIG. 1, the loss heat produced by the power semiconductor element 11 (which is mounted on the first portion 41) is effectively dissipated through the insulator 70. The bent portion 44 of the lead frame 40 is formed with a width smaller than that of the first and second portions 41 and 42 and the second portion 42 of the lead frame 40 connected to the terminals 43 is bent in a direction opposite to the insulator 70. Thus, when mounting the semiconductor power module 100 to an application device having an unlimited radiating plate, the terminals 43 may be spaced sufficiently apart a predetermined distance from the unlimited radiating plate while preventing contact therebetween.

The heat detection circuit 20 may be formed on the second portion 42 of the lead frame 40 instead of on the first portion 41. Alternatively, the heat detection circuit 20 may be dispensed with altogether. Further, the control circuit 30 may be formed on the first portion 41 of the lead frame 40 while maintaining constant performance characteristics by making appropriate modifications to the semiconductor power module 100.

In manufacturing the semiconductor power module 100 shown in FIG. 1, the lead frame 40 may be fabricated using a stamping operation. A solder preform (e.g., solder paste) may then be formed on the lead frame 40 and chips such as the power semiconductor element 11, the thermistor element 21 and the integrated circuit element 31 are placed onto the pads 211, 311, and 411. The composition of the solder preform is selected and controlled so that the preform material can be melted at a temperature of about 300° C. The power semiconductor element 11 is oriented on the first portion 41 of the lead frame 40 near to the outer periphery of the semiconductor power module 100 so that the loss heat generated by the semiconductor element 11 may be more easily dissipated.

After the various die used within the semiconductor power module 100 have been mounted to the lead frame 40, the electrodes of the semiconductor element 11, the thermistor 21 and the integrated circuit element 31 are wire-bonded to suitable portions of the wiring interconnection pattern formed by the lead frame 40. This wire-bonding operation may be any known process such as, for example, wedge or ball bonding, using any suitable wire material, such as, for example, aluminum or gold.

Following the die-bonding operation, the lead frame with chips mounted thereto is covered with an epoxy molding compound to form the sealer 60. Preferably, the epoxy is cured at about 160° C. to 170° C., however, other temperatures and curing conditions (e.g., using ultraviolet cured epoxy) may be used without departing from the scope of the invention.

Figure 4:
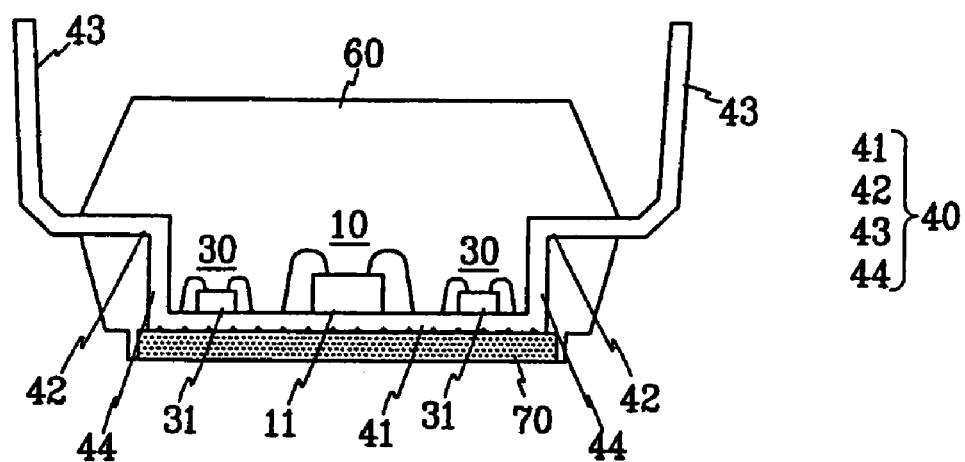
FIG. 4 is an exemplary cross-sectional diagrammatic view of a semiconductor power module according to a further embodiment of the invention.
Figure 5:
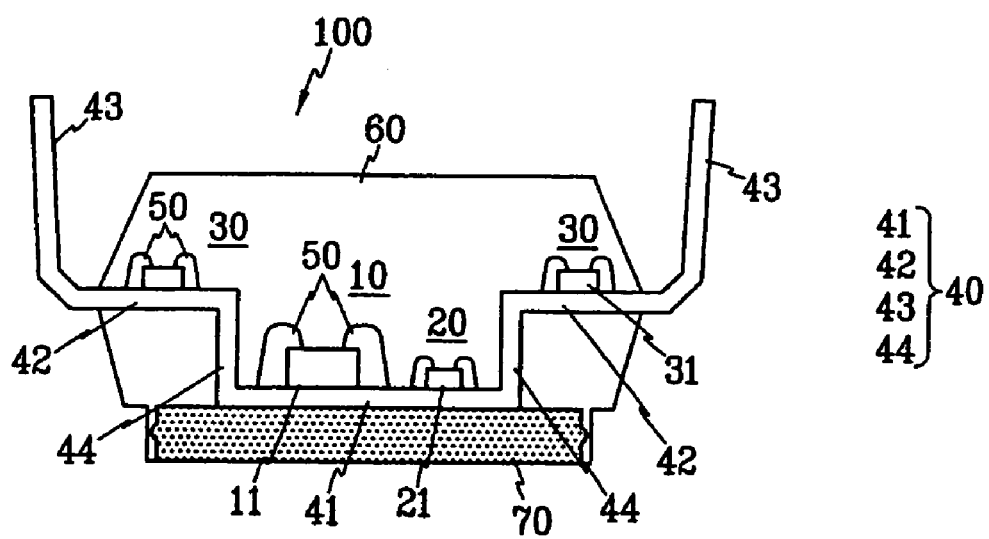
FIG. 5 is an exemplary cross-sectional diagrammatic view of a semiconductor power module according to yet another embodiment of the invention.

After application of the sealer 60, the insulator 70, which may be sheet shaped, is adhered adjacent to the bottom surface of the lead frame 40 near the first portion 41. In operation, the insulator 70 functions as a heat sink and effectively dissipates the loss heat generated by the power semiconductor element 11. Additionally, the insulator 70 functions to evenly distribute stresses from external impacts to prevent the occurrence of cracks and other types of damage to the power semiconductor module 100. In some embodiments, the insulator 70 may be adhered to the lead frame 40 as shown in FIG. 4 using an adhesive containing a filler such as $Al_2O_3$, AlN, or BeO, which provide good electrical insulation properties and good thermal conductivity. Further, the insulator 70 may be bent to prevent deflection transformation thereof caused by adherence of other materials thereto. In other embodiments, the sealer 60 and the insulator 70 may have rings or grooves that enable the insulator 70 to be detachably mounted (e.g., pressed on, threaded on, etc.) to the semiconductor power module 100 as shown in FIG. 5.

Figure 3:
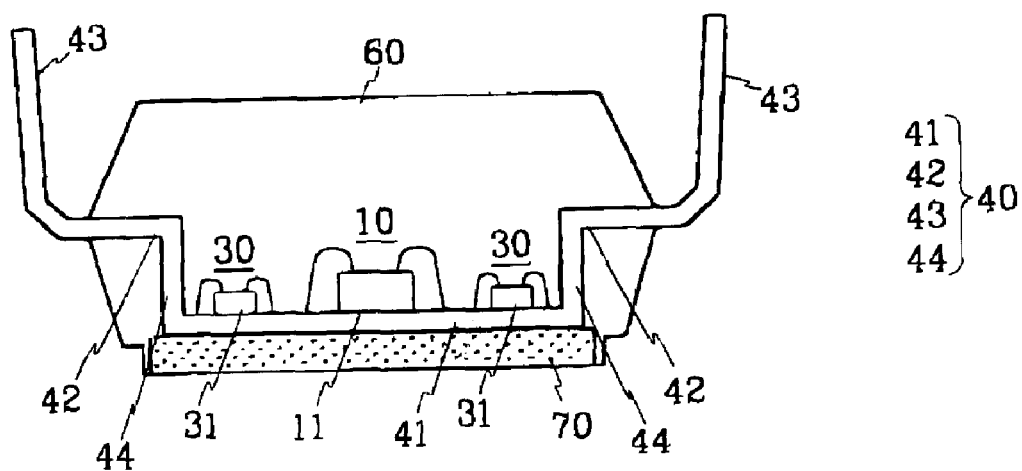
FIG. 3 is an exemplary cross-sectional diagrammatic view of a semiconductor power module according to another embodiment of the invention.

FIG. 3 is an exemplary cross-sectional diagrammatic view of a power module according to another embodiment of the invention. The power module shown in FIG. 3 includes many of the same or similar components that are used in the embodiment shown in FIG. 1. However, in the power module shown in FIG. 3, the heat detection circuit 20 has been omitted and the control circuit 30 is formed on the first portion 41 of the lead frame 40.

A range of changes and modifications can be made to the preferred embodiment described above. The foregoing detailed description should be regarded as illustrative rather than limiting and the following claims, including all equivalents, are intended to define the scope of the invention.

What is claimed is:

1. A semiconductor power module, comprising:
    a lead frame having a first portion at a first level, a second portion surrounding the first portion at a second level, and a plurality of terminals connected to the second portion, wherein the first and the second portions and the terminals are made of one body;
    a power circuit mounted on a first surface of the first portion;
    a control circuit mounted on the first surface of the first portion or the second portion that drives the power circuit;
    a heat detection circuit mounted on the first surface of the first portion that detects the heat produced by the power circuit;
    a heat sink having an electrically insulating property and thermal conductivity, wherein the heat sink has a first surface adjacent to a second surface of the first portion, and a second surface opposite to the first surface and exposed to the outside; and
    a sealer having an electrically insulating property and thermal conductivity, wherein the sealer covers the power circuit.

2. The semiconductor power module of claim 1, wherein the first portion of the lead frame is centrally positioned within the lead frame.

3. The semiconductor power module of claim 1, wherein the power circuit includes a power semiconductor element.

4. The semiconductor power module of claim 1, wherein the first surface of the first portion is a top surface and wherein the second surface of the first portion is a bottom surface.

5. The semiconductor power module of claim 1, wherein the heat sink is adhered to at least one of the lead frame and the sealer with an adhesive.

6. The semiconductor power module of claim 5, wherein the adhesive contains a filler that includes at least one compound selected from the group consisting of $Al_2O_3$, AlN and BeO.

7. The semiconductor power module of claim 1, wherein the heat sink and the sealer each have grooves or rings and wherein the heat sink and the sealer are connected to each other by means of the grooves or the rings.

8. The semiconductor power module of claim 1, wherein the heat sink is sheet-shaped.

9. The semiconductor power module of claim 1, wherein the heat sink comprises at least one compound selected from the group consisting of AlN and BeO.

* * * * *